United States Patent
Alfaro et al.

(10) Patent No.: US 6,371,799 B1
(45) Date of Patent: Apr. 16, 2002

(54) INTERFACES AND HOUSING FOR A VEHICLE ELECTRIC POWER DISTRIBUTION SYSTEM

(75) Inventors: Conrad F. Alfaro, Bolingbrook; Jacek Korczynski, Niles; Craig A. Beschorner, Hoffmann Estates, all of IL (US)

(73) Assignee: Cooper Technologies, Houston, TX (US)

( * ) Notice: Subject to any disclaimer, the term of this patent is extended or adjusted under 35 U.S.C. 154(b) by 17 days.

(21) Appl. No.: 09/607,390

(22) Filed: Jun. 30, 2000

Related U.S. Application Data (63) Continuation-in-part of application No. 09/319,223, filed as application No. PCT/US96/17208 on Oct. 28, 1996, which is a continuation-in-part of application No. PCT/US95/10016, filed on Aug. 8, 1995, which is a continuation-in-part of application No. 08/287,623, filed on Aug. 8, 1994, now Pat. No. 5,587,890.

(51) Int. Cl.[7] .............................................. H01R 29/00
(52) U.S. Cl. ...................................................... 439/516
(58) Field of Search .................................. 439/516, 76.2, 439/99, 45, 47; 361/826, 791, 760, 761, 762, 767, 778, 752, 796, 805; 174/260

(56) References Cited

U.S. PATENT DOCUMENTS 5,229,922 A * 7/1993 Maramatsu et al. ........ 361/395

* cited by examiner

Primary Examiner—Tulsidas Patel
(74) Attorney, Agent, or Firm—Armstrong Teasdale LLP (57) ABSTRACT

A vehicle electric power distribution apparatus is described which includes multiple stacked conductive layers. Electrically insulating material insulates portions of the conductive layers and conductive pins provide electrical contact between selected contact pads of different layers. At least some of the layers include contacts providing access to one or more external connectors. The apparatus is enclosed in a housing configured with multiple ventilation and mounting options and are further configured to retain connector housings between a top and bottom for the contacts described above. The housing further includes a cover hingedly connected to the top to form either a splash proof seal or ventilation.

9 Claims, 9 Drawing Sheets

INTERFACES AND HOUSING FOR A VEHICLE ELECTRIC POWER DISTRIBUTION SYSTEM

CROSS REFERENCE TO RELATED APPLICATIONS

This application is a Continuation-in-Part of U.S. patent application Ser. No. 09/319,223, filed Mar. 23, 2000, which is a filing under 35 U.S.C. of 371 of PCT/US96/17208 filed on Oct. 28, 1996, which is a Continuation-in-Part of PCT/US95/10016 filed on Aug. 8, 1995, and which is a Continuation-in-Part of U.S. patent application Ser. No. 08/287,623, filed on Aug. 8, 1994, now issued U.S. Pat. No. 5,587,890.

BACKGROUND OF THE INVENTION

This invention relates generally to a distribution system for electrical signals, and, more particularly, to a vehicle electrical power distribution system.

Modern vehicles have an immense collection of electrical hardware. In passenger cars, for example, the electrical hardware may include some or all of: stereo sound equipment, engine control systems, air conditioning, power windows, mirrors and seats, keyless entry systems, alarms, and even electrically heated seats. The complexity of vehicle electrical systems has grown almost exponentially since the automobile's introduction.

The growth in the amount of electrical equipment is not limited to passenger vehicles. Large commercial and industrial vehicles also have an impressive array of electrical and electronic circuitry from hydraulic controls, refrigeration needs, and safety equipment in addition to many of the features found in an automobile.

A vehicle electrical system is a formidable combination of high-current and low-current circuitry. In many cases, relays are required for control purposes, and all circuits must be adequately fused to protect expensive components and to guard against the danger of fire. In order to facilitate the replacement of fuses and relays, and to simplify interconnection of electrical hardware, many different electric power distribution systems have been employed.

Centralized fuse and relay mounting is the preferred method of electrical management for modern vehicles, with the routing of input and output connections from this central location. This entails, however, an appreciable amount of point-to-point wiring thereby increasing manufacturing and assembly costs and possibly negatively impacting product quality due to wiring errors.

Accordingly it would be desirable to provide a vehicle electric power distribution system that can be customized for a particular vehicle with relative ease, that avoids high tooling costs for custom designed components, that is reliable in a high current environment, that will accommodate a wide range of fuse and relay packages, and that is relatively inexpensive to manufacture. It would further be desirable to provide an electrical distribution system housing which includes flexibility, aids wiring design and provides options for connectivity to external circuits.

BRIEF SUMMARY OF THE INVENTION

A vehicle electric power distribution apparatus is described which includes a plurality of vertically stacked conductive circuit layers, each layer including a rectangular array of contact pads, where some of the contact pads are electrically connected to selected other contact pads of the same conductive circuit layer via integrally formed conductive traces. At least one of the conductive circuit layers includes at least one integrally formed electrical contact coplanar therewith. The contact extends out from the conductive circuit layer to make electrical contact with at least one of the contact pads, and the contacts are arranged to provide electrical contact with an external electric power distribution network.

Electrically insulating material is used to insulate portions of the conductive circuit layers and conductive pins are used to provide electrical contact between selected contact pads of the different selected conductive circuit layers, the conductive pins being enclosed within an electrical connector.

A housing encloses the vertically stacked conductive circuit layers and includes a top portion and a bottom portion. The top portion and bottom portion of the housing are configured to receive at least one connector housing for acceptance of input and output contacts between the top portion and the bottom portion. Other features of the housing include a bottom surface with sides sloping slightly upward and configured to provide ventilation and escape of moisture from the housing. At the center of the bottom surface, a raised portion extending from the bottom surface also provides ventilation. Multiple molded ribs extending from the center to the sides of the bottom surface add strength to the structure. In addition, multiple mounting lugs are located about a periphery of the bottom portion of the housing. In addition to the external mounting lugs, the housing includes integral mounting lugs located within a housing compartment formed by joining the top and bottom portions of the housing.

The housing further includes a cover hingedly connected to the top portion. In one configuration the cover is configured to form a water splash proof seal with the top portion. In another configuration, the cover is configured with slots to provide ventilation.

The vehicle electric power distribution apparatus summarized above solves a need for simple electrical distribution customization in that the apparatus can be customized for particular applications with relative ease, thereby avoiding high tooling costs for custom designed components. The apparatus is reliable in a high current environment, accommodates a wide range of fuse and relay packages, and is relatively inexpensive to manufacture. The apparatus is also contained within a housing which includes flexibility, aids wiring design and provides options for connectivity to external circuits.

DETAILED DESCRIPTION OF THE INVENTION

Figures 1A, 1B:
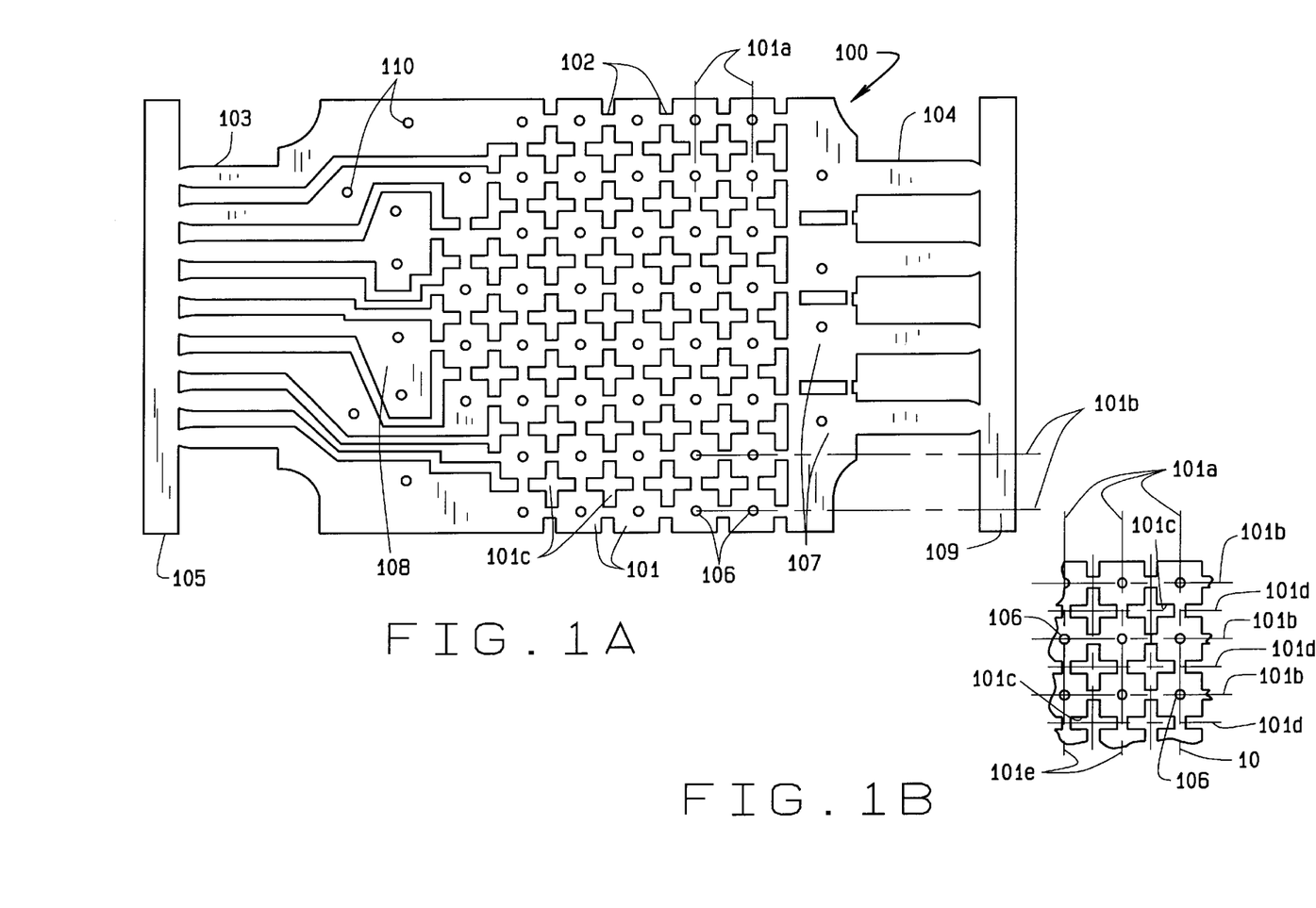
FIG. 1(a) is an enlarged top plan view of a stamped conductive plate of the present invention.
FIG. 1(b) is a partial enlarged plan view taken along line 1b of FIG. 1(a)

FIGS. 1(a) and 1(b) are top plan views of one exemplary conductive circuit layer or plate for use with the invention, and generally depicted by the numeral 100. Preferably, the conductive circuit layer or plate is fabricated by stamping from a conductive metal sheet having a thickness of from 0.020 to 0.050 inches. Many different conductive materials of varied thicknesses would be acceptable, depending upon the intended use of the circuit layer. For vehicle uses, the preferred metal is copper. The conductive layer shown is stamped from 0.032 inch CDA 110 half hard copper. In order to facilitate subsequent soldering operations, the conductive circuit layer is solder plated or coated to provide a solder plate thickness of about 0.0002 to about 0.0004 inch. The conductive material may be preplated before the stamping operation, or a plating may be added later. One of the preferred solder plating compositions for a copper base is a tin solder composition. Of course, other suitable plating compositions, known to those skilled in the applicable art, may be substituted for the solder plating just described.

A feature of conductive circuit layer 100 is a plurality of interconnected first contact pads 101, and a plurality of second contact pads 107 and third contact pads 108. Contact pads 101 are preferably all identical, and second contact pads 107 are generally adjacent one end of the conductive plate, while third contact pads 108 are generally adjacent the other end of the conductive plate. The contact pads 101 are arranged to provide a right angle grid pattern as shown in FIG. 1(b). That is, vertical groups of contact pads have a vertical center lines 101A extending parallel to each other, and the horizontal groups of contact pads have horizontal center lines 101B extending parallel to each other. The horizontal center lines 101B intersect the vertical center lines 101A at right angles. The vertical center lines 101A are each equally spaced apart from each other, and preferably spaced apart to accommodate a minifuse, such as an ATM-style minifuse manufactured by Bussmann Division of Cooper Industries.

The horizontal center lines 101B are also each equally spaced apart from each other and preferably spaced apart to accommodate a minifuse as described above. Thus, both the vertical and horizontal contact pad center lines are spaced apart the same distance. In one preferred embodiment, the contact pad center lines are spaced apart a distance of about 0.320 inch.

In alternative embodiments, other arrangements of contact pads are employed, including, but not limited to, triangular, hexagonal, circular, elliptical, or combinations thereof to accommodate a particular application. With a triangular or hexagonal array of contact pads, for example, the coordinate system formed by the contact pad centerlines would no longer be rectangular in nature, but would form, in one instance, concentric triangles or hexagons. Centerline spacings would still be arranged to conform to the contact spacing of industry standard components.

For any array of contact pads, center-to-center spacing would be such to accommodate components with standard lead spacing (or an integral multiple of a standard spacing) in more than one direction, thus providing a great deal of component orientation flexibility.

First contact pads 101 are shown as having a substantially rectangular shape. However, the shape of the contact pads is best determined by the ultimate use of the circuit layer. Use may dictate that the contact pads be square, triangular, circular, elliptical, or any desired shape. Although first contact pads 101 are depicted in the figure as having holes 106 of a uniform size therethrough, the contact pads could also be fabricated without holes, or with holes of varying dimensions. Second and third contact pads 107 and 108 have irregular shapes that are used to hold various other components such as relays and other size fuses.

Contact pads 101, 107 and 108 are shown electrically connected to selected other contact pads by integrally formed conductive traces 102. In one preferred embodiment, there are at least three conductive traces 102 for each pad 101. These conductive traces 102 are formed by the stamping die used for conductive circuit layer fabrication, although other methods of forming these traces are not precluded, and will occur to those of skill in this fabrication art. Both the conductive circuit layer and the conductive traces could be fabricated by using an etching process, for example. In application, some of these conductive traces 102 are removed by a subsequent operation to ensure that electrical connection is made only between selected ones of contact pads 101, 107 and 108, as discussed in greater detail hereinafter.

Conductive circuit layer 100 also includes a plurality of electrical contacts 103 at one end of the circuit layer, and a plurality of electrical contacts 104 at the other end of the circuit layer. The electrical contacts 103 and 104 are preferably integrally formed during fabrication, and are coplanar with and extend outwardly from the conductive circuit layer main body section. FIG. 1 shows these contacts 103 and 104 as joined at a point distal from the main body of the conductive circuit layer by bars of material 105 and 109. The contacts are formed in this way during the fabrication process to keep the contacts from being bent or otherwise damaged. The bars of material 105 and 109 can be removed by a cutting operation at a later stage of manufacture. In the alternative, of course, the bars of material 105 and 109 need not be used at all.

Another feature is that holes 110 in the second and third contact pads 107 and 108 are not centered on these pads and are located to facilitate electrical connection to the conductive circuit layer in different arrangements than the rectangular array of contact pads described above. The mounting holes 110 are provided with varied spacings to accommodate electrical connection to electrical components of different sizes, and different mounting or socketing arrangements.

Figure 2A:
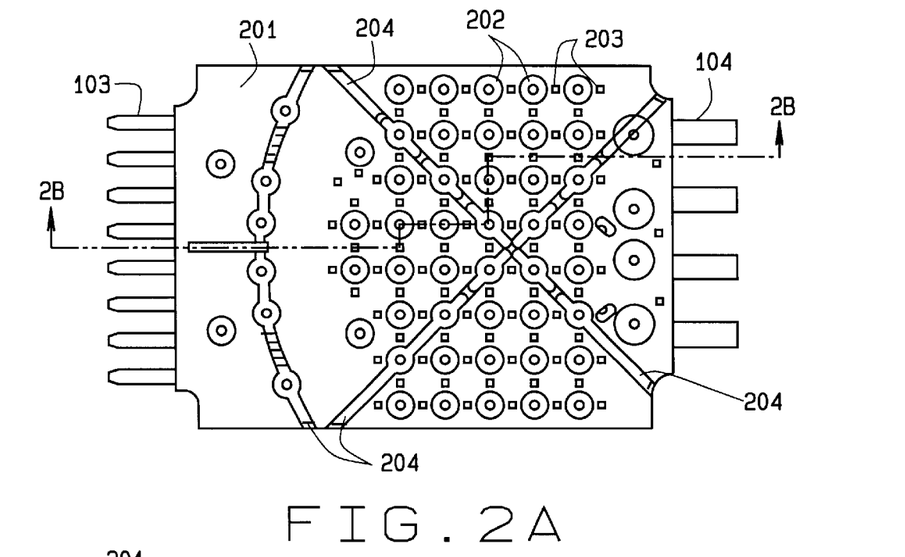
FIG. 2(a) is a top plan view of another embodiment of the present invention.
Figure 2B:
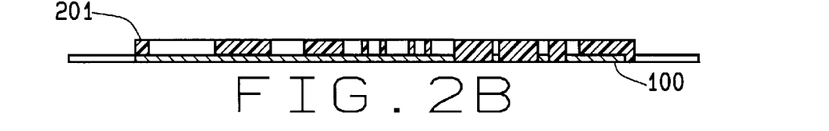
FIG. 2(b) is a cross-section view taken along lines 2(b)—2(b) of FIG. 2(a)
Figure 2C:
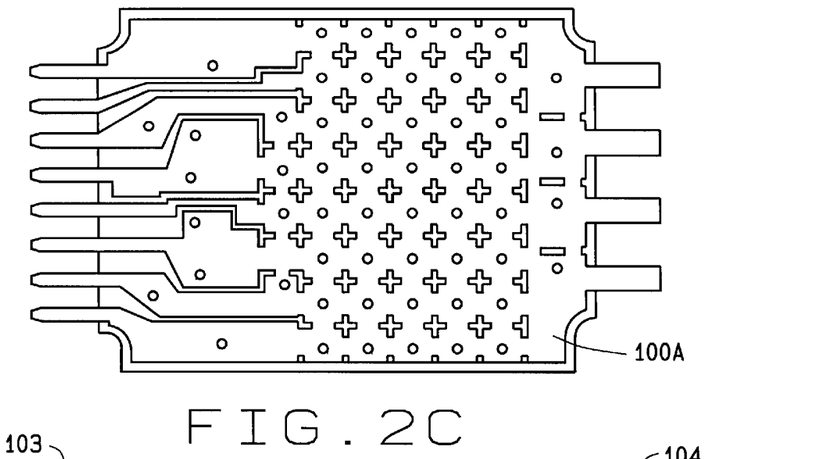
FIG. 2(c) is a bottom plan view of the conductive circuit layer of FIG. 2(a)

FIGS. 2(a)–2(c) illustrate yet other features of exemplary conductive layers for use with the present invention. These depict the conductive circuit layer 100A without the bars 105 and 109, and at least partially coated with an electrically insulating material 201. In one preferred embodiment, the electrically insulating material is Rynite FR530, 94V-0, manufactured by E.I. DuPont Company and described as a PET thermoplastic polyester, but any of a number of insulating plastic or other materials would serve in this application, as is well-known in the art. Preferably, the insulating material can be applied using an injection molding process, wherein the conductive circuit layer 100A is supported by pins or other supporting structure within the mold, and mold inserts determine the areas where the insulating material 201 is prevented from flowing. As a general statement, it can be said that the conductive circuit layer 100A is at least partially encapsulated or coated by the insulating material, with the exception of areas 202 near the central portions of the contact pads 101, areas 203 over the conductive traces 102 that interconnect selected contact pads 101, and areas 204 as noted. These areas are kept clear of the insulating material so that the traces 102 may be easily removed and portions of the contacts removed. Also shown in FIG. 2(a) are the electrical contacts 103 and 104, now freed from the restraining bars of material 105 and 109 illustrated in FIG. 1. It should be noted that the material from which the conductive circuit layer is fabricated permits a rotation of the electrical contacts 103 and 104, so that the plane of one or more of the electrical contacts 103 may be made perpendicular to the plane of the conductive layer itself. Although not shown in the figure, this ability to change the plane in which one or more of the electrical contacts is oriented adds greater flexibility in terms of interconnection with external power distribution networks, which may include electrical connectors and attached electrical wires.

FIG. 2(b) illustrates the relative thickness of the insulating material 201. Preferably, as shown in the figure, the insulating material 201 extends outward from the conductive circuit layer only in one direction, although this preferred application technique need not be strictly adhered to for proper assembly. FIG. 2(b) shows the vacated areas of the circuit layer, some of which are described above, where insulating material is not permitted to flow.

FIG. 2(c) is a bottom plan view of the conductive circuit layer 100A after the electrically insulating material 201 has been applied. As noted above, it is preferable in practicing the invention that the electrically insulating material be applied principally to only one side of the conductive circuit layer 100A. However, as has also been noted, this design practice need not be strictly adhered to for the invention to function properly.

Figure 2D:
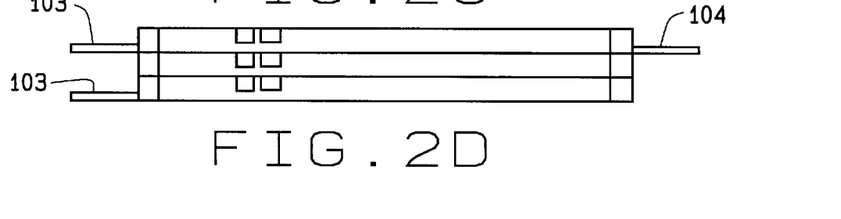
FIG. 2(d) is a side elevational view of another embodiment of the present invention.

FIG. 2(d) shows a side schematic of three conductive circuit layers 100A stacked vertically, one on top of another, with electrical contacts 103 and 104 extending outwardly therefrom. In this embodiment, the middle or second circuit layer has had the contacts 103 and 104 removed prior to being assembled, and the bottom or third circuit layer has had one set of contacts 104 removed. Depending upon the ultimate use, selected conductors from the groups 103 and 104 of conductors on each circuit layer may be removed.

The insulating material that adheres to each of the conductive circuit layers prevents unwanted electrical contact between different conductive circuit layers. The insulating material also serves another purpose. The insulating layers also provide equal spacing for the conductive plates, and help maintain the conductive plates in a substantially parallel relationship.

As mentioned above, with reference to FIG. 2(a), the insulating material is deliberately kept away form certain areas; namely, the areas around the central portions of the contact pads, and the areas around the integrally formed conductive traces. This is because a subsequent shearing operation serves to selectively remove the integrally formed conductive traces between selected contact pads where electrical contact is not desired. Coating or encapsulating the conductive circuit layer in the manner described acts to hold the conductive circuit layer together, even if it should become necessary to completely sever the electrical and physical connections between selected portions of the layer and the main body of the layer. Although it is not shown in the figure, the stamping operation that is used to form the conductive circuit layer can be constructed in such a way that it "kicks" portions of the conductive layer, such as the corners of the contact pads, out of the plane of the remainder of the conductive layer, so that these "kicked out" portions may be embedded more securely in the encapsulating insulating material, thus forming a stronger structure. Further, as will be discussed in more detail below, the openings previously described in the contact pads may require enlarging to conform to the inventive assembly process, and will also require soldering to ensure good electrical contact with selected other conductive layers. This is specifically why the central portions of the contact pads are left free of insulating material.

Figure 2E:
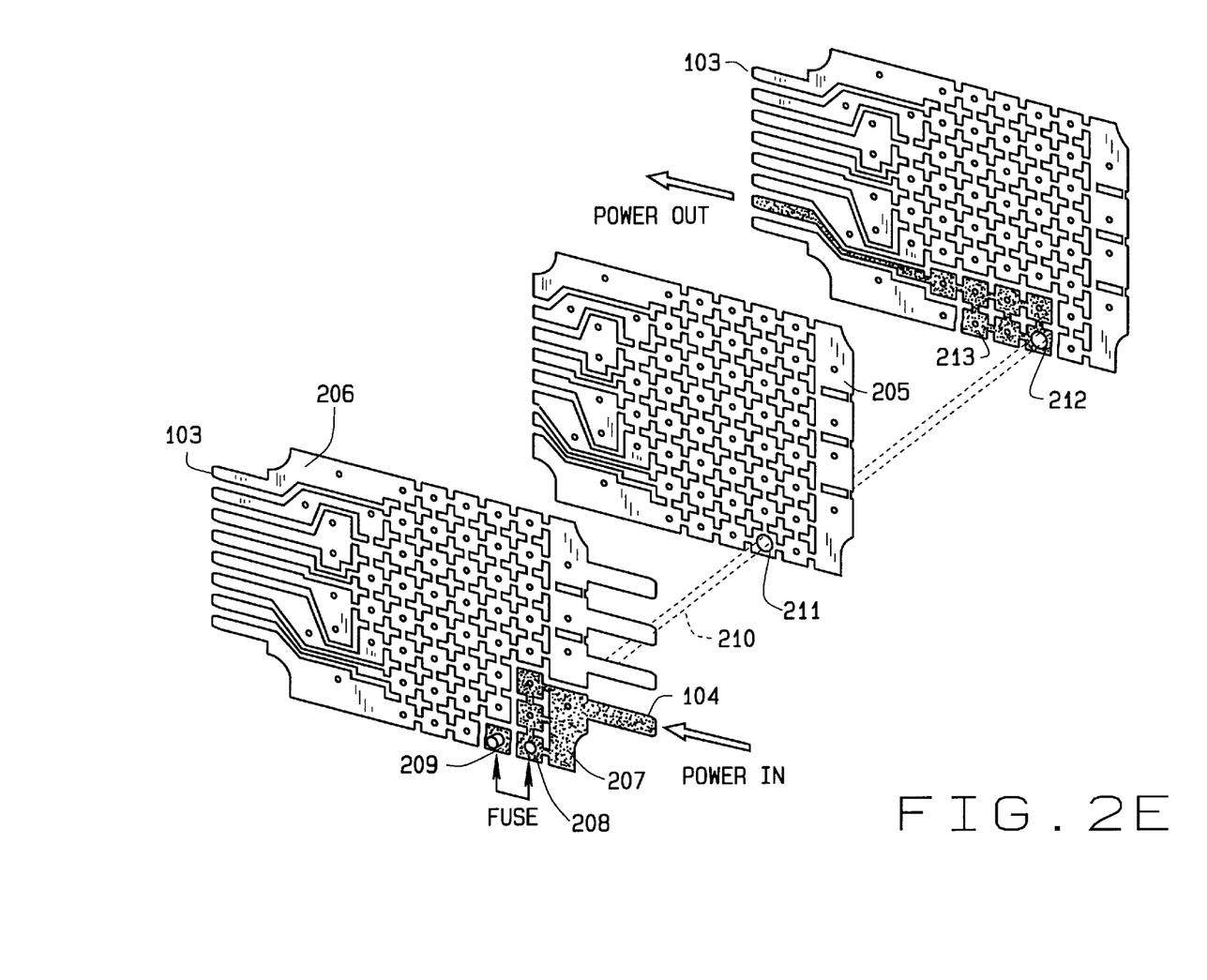
FIG. 2(e) is an enlarged view of the layout of the three conductive circuit layers used in FIG. 2(d)

FIG. 2(e) illustrates how a conductive path is formed within the apparatus. Three different conductive circuit layers 204, 205 and 206 are shown in the figure. It is important to note at this point that one of the significant economies of the apparatus is the fact that all conductive circuit layers are identical prior to the shearing operation that removes selected conductive traces. A single stamping tool is used to fabricate the conductive circuit layers, and a single mold-in-place operation coats or encapsulates the conductive circuit layers. It is not until the shearing operation that removes selected conductive traces that each conductive circuit layer begins to assume a unique identity.

The conductive circuit layers 204, 205 and 206 of FIG. 2(e) would, in one preferred embodiment, be coated or encapsulated with insulating material prior to the shearing operation that defines specific conductive paths, but, for the sake of clarity, the insulating material is not shown. Power may be applied to an upper conductive circuit layer 206 through an electrical contact 104. Note that conductive traces that originally connected adjacent contact pads around the periphery of the shaded area 207 of the upper conductive circuit layer 206 have been removed by a shearing operation, so that the shaded area 207 is electrically isolated from the surrounding region. The conductive path leads to a first contact pad 208, to which an electrical connector (not shown) would ordinarily be affixed to accommodate one terminal of a fuse, as indicated. A second adjacent contact pad 209 has also been electrically isolated from the remainder of the shaded region 207, so that another electrical connector may be provided to contact the remaining terminal of the fuse. Of course, electrical connectors are generally provided as a part of a conductive pin penetrating the conductive layers. For the sake of clarity, only one of the conductive pins 210 is shown, and much of its length is indicated in dashed lines, since the length has been exaggerated to present a clear view of the conductive circuit layers 204, 205 and 206. The conductive path extends through the first contact pad 207, through the fuse, to the second contact pad 209.

At this point, the conductive pin 210 makes electrical contact with the contact pad 209, and extends the conductive path in the direction of a second conductive circuit layer 205. For this particular conductive path, the second conductive circuit layer 205 is not involved, so the opening in the contact pad 211 through which the conductive pin 210 traverses has been enlarged so that the pin 210 does not make electrical contact at this point. Note also that the second conductive circuit layer 205 has had both sets of electrical contacts 103 and 104 removed by a shearing operation, since these contacts are not needed in this example.

The conductive path continues via the conductive pin 210 to a bottom conductive circuit layer 204, where the pin makes electrical contact with the contact pad 212 through which it passes. The shaded area 213 of the bottom conductive circuit layer 204 has been electrically isolated from the surrounding portions by removal of the conductive traces that originally connected adjacent contact pads around the periphery of the shaded area 213. The conductive path continues to an electrical contact 103 extending outwardly from the conductive circuit layer, through which power may now be distributed via an external distribution network that connects to the electrical contact 103 via a mating connector and cable assembly (not shown).

Figure 2F:
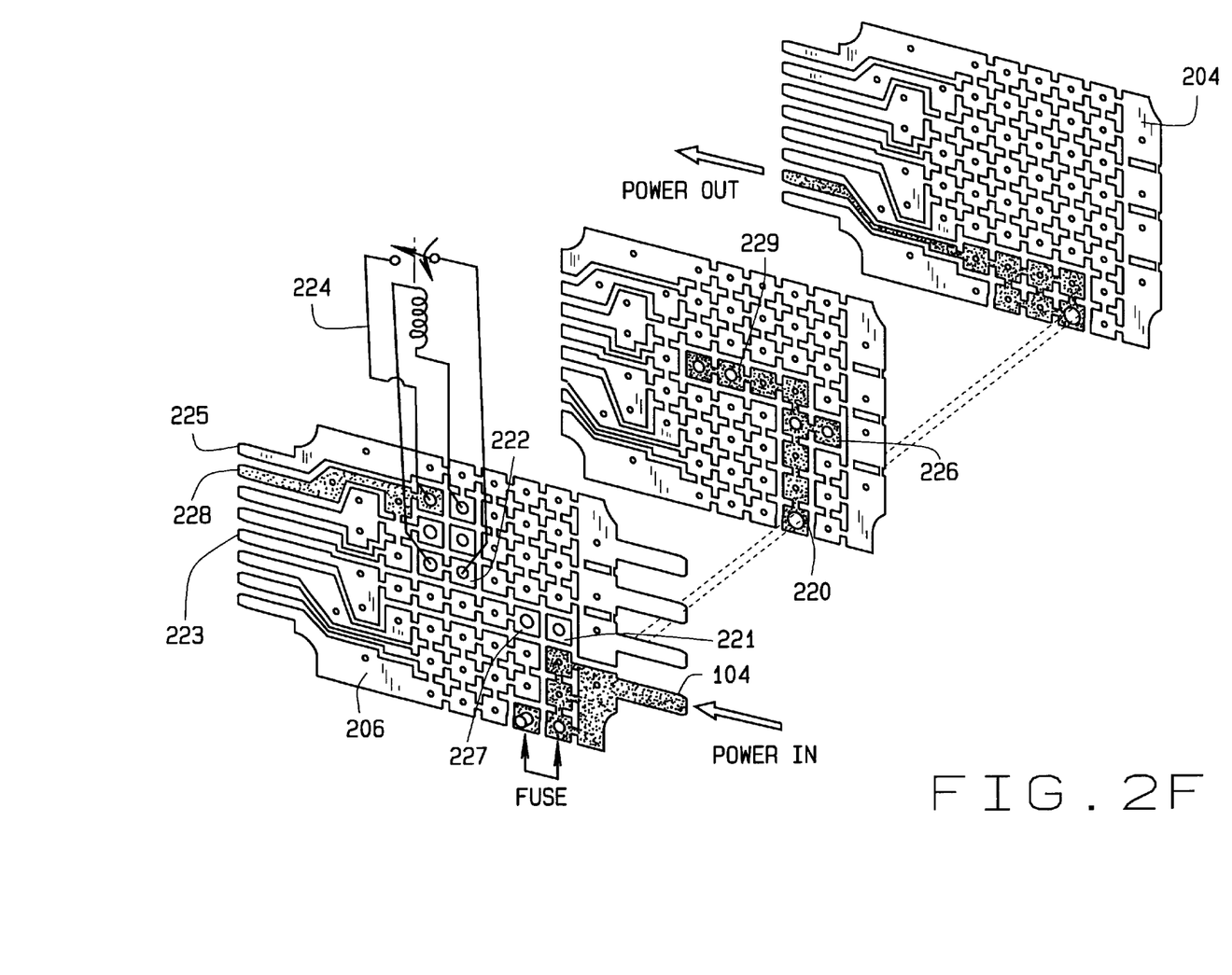
FIG. 2(f) illustrates yet another layout of the three conductive circuit layers used in FIG. 2(d)

FIG. 2(f) is an alternative representation of conductive circuit layout. Power is applied to an electrical contact 104 on an upper circuit layer 206, where it is distributed to a middle layer 205 by the conductive pin arrangement described above (all pins not shown, for the sake of clarity). From a contact pad on the middle layer 205, power is distributed over the contact pads shown in the shaded area 220, where power is fed back to the top layer 206 through a set of contact pads 226 and 221 connected by a conductive pin (not shown). A fuse or other suitably spaced component can then be placed between contact pads 221 and 227, using the electrical terminals in which the pins terminate, as described above, with output power proceeding to one to the electrical contacts 223 at the edge of the circuit layer. Power is also fed through to the top circuit layer to contact 222, where it is applied to a relay package 224, which is shown schematically. When a control signal (electrical ground) is applied to the appropriate relay contact through the input electrical connector 225, the relay energizes, and the output voltage appears at the appropriate output contact 228.

Figure 3:
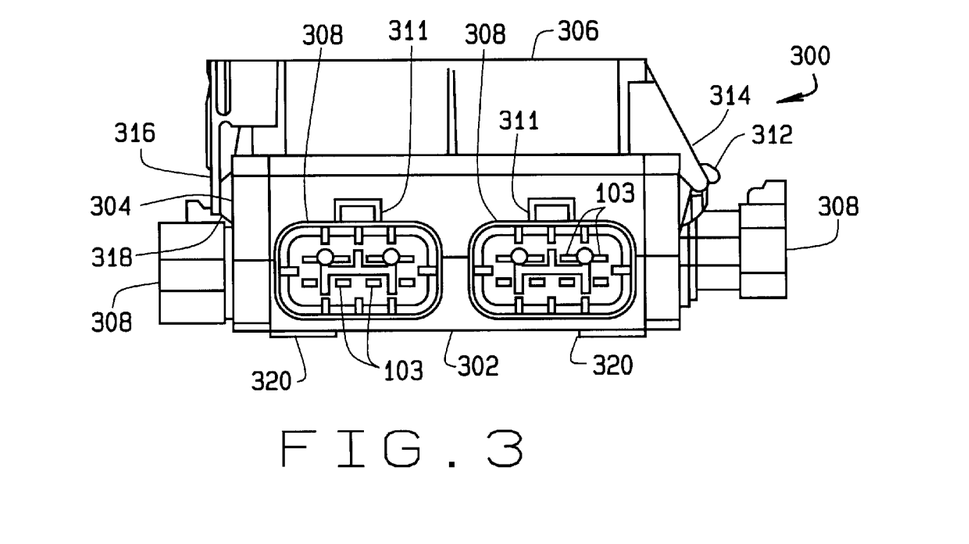
FIG. 3 is side view of a vehicle electric power distribution system.

FIG. 3 is a side view of an electrical distribution housing 300 for containing the above described exemplary contact plates 204, 205 and 206 (shown in FIG. 2f). Included in housing 300 are a bottom portion 302, a top portion 304 and a cover 306. As shown in FIG. 3 housing 300 also includes connector housings 308 which when mounted serve as a housing for contacts 103 (also shown in FIGS. 1a, 2d, 2e and 2f) and 104 (shown in FIGS. 1a, 2d, 2e and 2f) which extend from conductive plates 204, 205 and 206 (shown in FIG. 2f). Connector housings 308 are mounted between top portion 304 and bottom portion 302 and sized and shaped to accommodate a connection to contacts 103 and 104. Connector housings 308 also include a molded latch 311 used to retain a raised tab of a mating connector (described below) and a connector position assurance device (also described below). Cover 306 is either configured for a water splash proof seal with top portion 304 to protect electronics, such as, for example, fuses or relays used within electric power distribution housing 300 or alternatively can be vented for heat dissipation. In one embodiment, cover 306 is hingedly attached to top portion 304 via a hook assembly 312 molded into top portion 304 and an eye assembly 314 molded into cover 306. A latching mechanism 316 molded into cover 306 latches onto a catch assembly 318 molded into top portion 304 to complete snap-fit attachment of cover 306 to top portion 304. A side view of internal lugs 320 is shown as a part of bottom portion 302 and is described in detail below.

Figure 4:
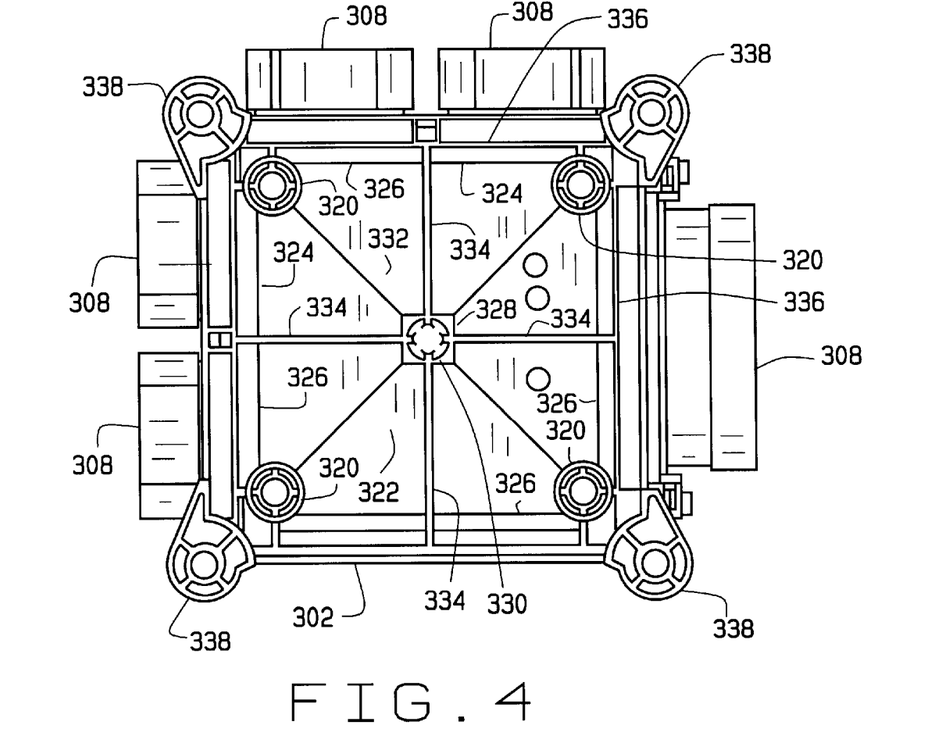
FIG. 4 is a bottom view of the vehicle electric power distribution system shown in FIG. 3.

FIG. 4 is a bottom view of bottom portion 302 of a vehicle electric power distribution housing 300 (shown in FIG. 3). Bottom portion 302 is substantially rectangular and includes a bottom surface 322. Bottom surface 322 is moldably connected to bottom portion 302 at a plurality of locations along a surface 324. Locations along surface 324 not moldably connected to bottom portion 302 provide ventilation for escape of moisture from housing 300.

Bottom surface 322 is substantially rectangular and includes four sloped sides 326 extending slightly upward (from a bottom view perspective) to a center 328 of bottom surface 322. Center 328 includes a raised portion 330 extending from bottom surface 322, thereby providing ventilation for housing 300. Bottom surface 322 further includes a topside (not shown) and a bottom side 332 including molded ribs 334 extending from center 328 to sides 336 of bottom portion 302 to provide support and strength.

Bottom portion 302 further includes multiple mounting lugs 338 extending from bottom portion 302 and located external to a housing compartment (not shown) formed by adjoining a top portion 304 (shown in FIG. 3) and bottom portion 302 of housing 300. Mounting lugs 338 are formed in an arrangement that allows for vertical or side-by-side stacking of multiple housings 300. Integral lugs 320 are molded into both bottom portion 302 and top portion 304 and are used for attaching top portion 304 to bottom portion 302 using known attachment members, for example, a nut and bolt or rivets. Depending on the application, integral lugs 320 may be used for mounting electrical distribution housings 300. In addition, lug designs described above allow for the stacking of multiple electrical distribution housings 300.

Also shown in FIG. 4 are multiple connector housings 308. Unlike known electrical distribution housings, where connector housings are molded as a part of the top portion and the bottom portions of the electrical distribution housings, in one embodiment of the present invention, bottom portion 302 and top portion 304 (shown in FIG. 3) are molded to receive at least one connector housing 308 which accepts input and output connector contacts that are a portion of the conductive plates 204, 205 and 206 (shown in FIG. 2f) described above. Thus, connector housings 308 are fitted between the top portion 304 and bottom portion 302 of the electrical distribution housing 300. In particular applications, where a lesser number of connector housings 308 are needed, molded vertical walls (not shown) can be inserted between top portion 304 and bottom portion 302 to seal off where top portion 304 and bottom portion 302 are molded to receive one or more of connector housings 308.

Figure 5:
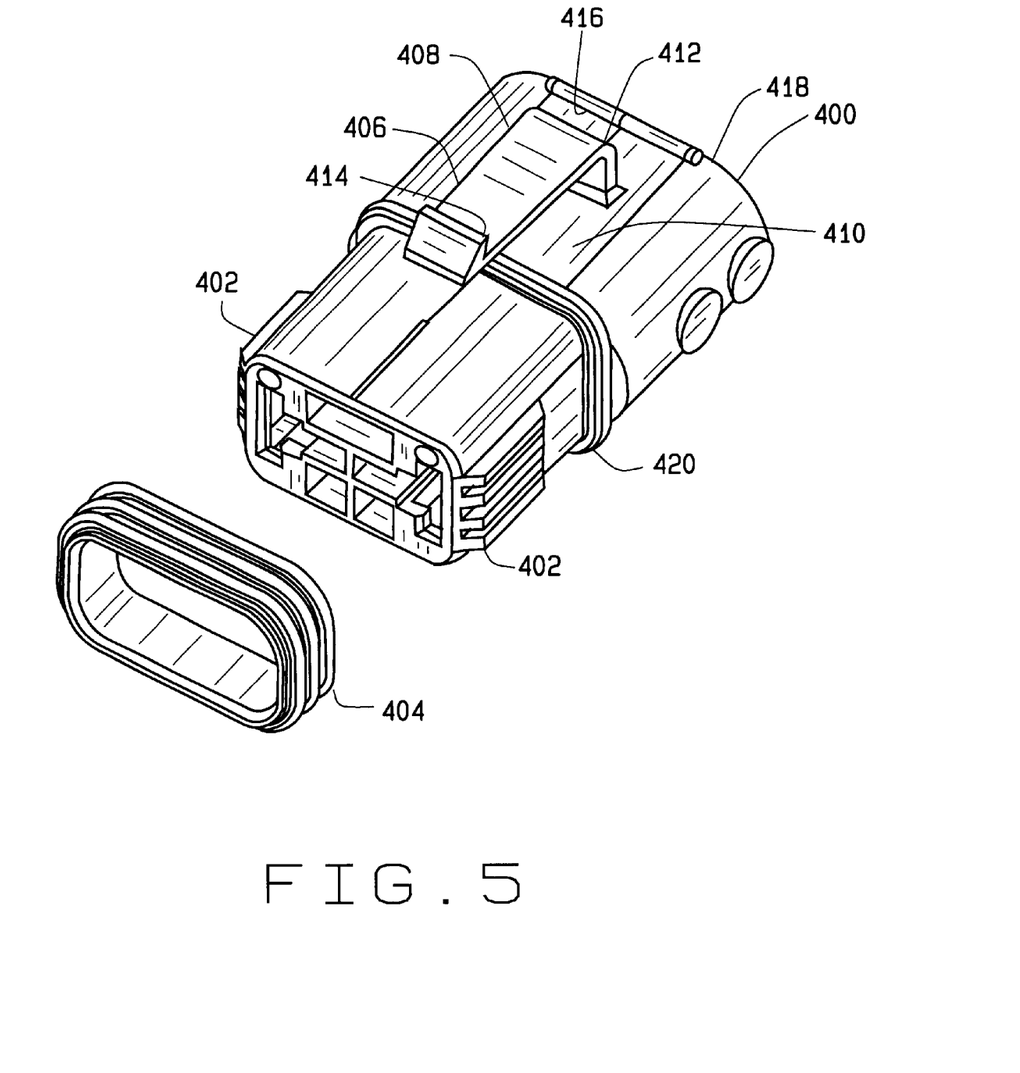
FIG. 5 is a perspective view of one exemplary connector used to mate to the vehicle electric power distribution system shown in FIG. 3.

FIG. 5 is a perspective view of a mating connector 400 configured to mate with one of connector housings 308 (shown in FIGS. 3 and 4). Mating connector 400 includes a plurality of keying extrusions 402 to ensure that connector 400 is attached to the proper one of connector housings 308 for the particular application. In one embodiment, connector housings 308 and mating connectors 400 are injection molded from plastics of multiple colors so that color coding also helps to ensure mistake free connector and connector housing mating. A sealing ring 404 fits over the perimeter of connector 400 for placement behind keying extrusions 402 to provide protection from, for example, dirt and moisture at a connection point of the contacts 103 (shown in FIG. 3) and 104 (shown in FIGS. 1a, 2d, 2e and 2f). A latching mechanism 406 is also molded as part of connector 400. A rectangular section 408 extends perpendicularly from a top surface 410 of connect or 400 for a distance and makes a rounded 90 degree turn 412 after which section 408 extends parallel to top surface 410 for a distance until finally terminating in a raised tab 414. Raised tab 414 locks by engaging latch 311 (shown in FIG. 3) molded into connector housing 308 to secure the mating of connector 400 and connector housing 308. A reinforcing rib (not shown) is molded between a portion of top surface 410 and rectangular section 408 to provide strength to the location where rectangular section 408 begins to extend from top surface 410. Connector 400 also includes a molded semi-circular section 416 near a back edge 418 on both top surface 410 and bottom surface (not shown) of connector 400. The function of semi-circular section 416 is to retain a terminal (or contact) position device as described below. A molded collar 420 provides a stop when inserting sealing ring 404.

Figure 6:
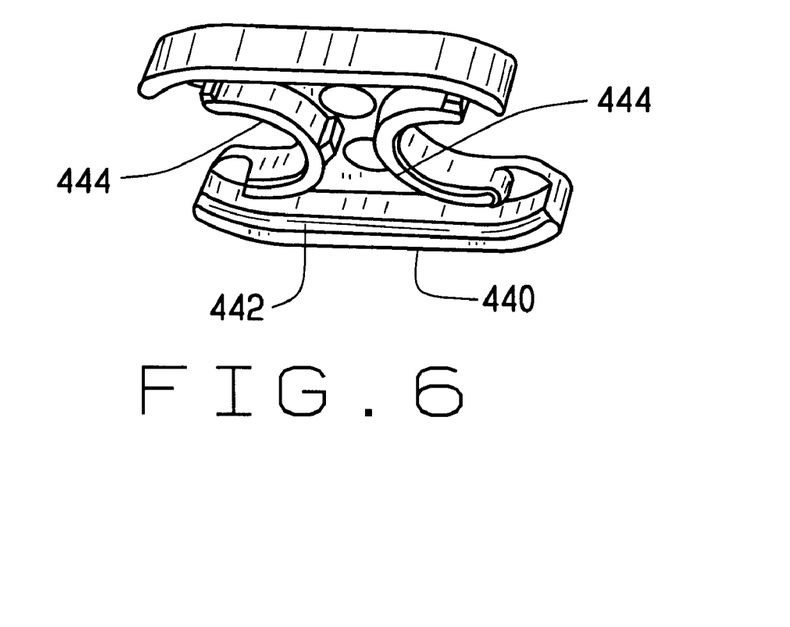
FIG. 6 is a perspective view of one exemplary terminal position assurance device for a connector as shown in FIG. 5 that is sealed.

FIG. 6 illustrates a sealed terminal position assurance device 440 according to one embodiment of the present invention. Device 440 is molded to fit around back edge 418 of connector 400 (both shown in FIG. 5) and includes a molded clip 442 which engages semi-circular section 416 (shown in FIG. 5) for snap-fit connection with connector 400. Device 440 also includes semi-circular extrusions 444 which are used to provide resistance against rubber seals (not shown) which are placed over wires (not shown) before contacts (not shown) are crimped onto wires and inserted into connector 400. The resistance is a redundant safety measure designed to prevent contacts from backing out of connector 400 in case of failure of molded retention extrusions (not shown) within connector 400 which engage and retain contacts within connector 400.

Figure 7:
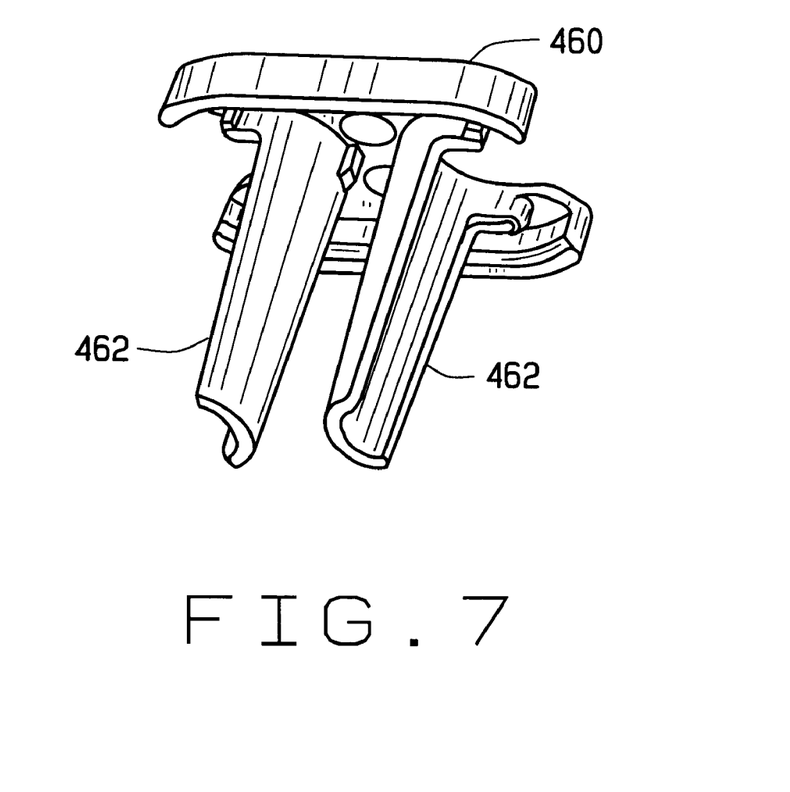
FIG. 7 is a perspective view of one exemplary terminal position assurance device for a connector as shown in FIG. 5 that is non-sealed.

FIG. 7 shows a non-sealed terminal position assurance device 460 according to another embodiment of the present invention. Device 460 retains the qualities of device 440 (shown in FIG. 6) except that semi-circular extrusions 462 are elongated and somewhat conically shaped to extend into a contact insertion area (not shown) of connector 400 (shown in FIG. 5). While device 440 provides resistance against rubber seals, other applications of connector housing 308 and connector 400 do not employ the rubber seals. Instead, extrusion 462 are designed to engage contacts (not shown) which are crimped onto wires and inserted into connector as described above, and prevent the contacts from backing out of connector 400 by butting up against a portion of a contact. Unlike known terminal positioning devices, both device 440 and device 460 allow removal or extraction from connector 400 without a tool.

Although FIGS. 5, 6 and 7 show two contact connector and terminal position devices, it is to be understood that other embodiments of connectors and terminal position devices which include more than two contacts are within the scope of the invention.

Figure 8:
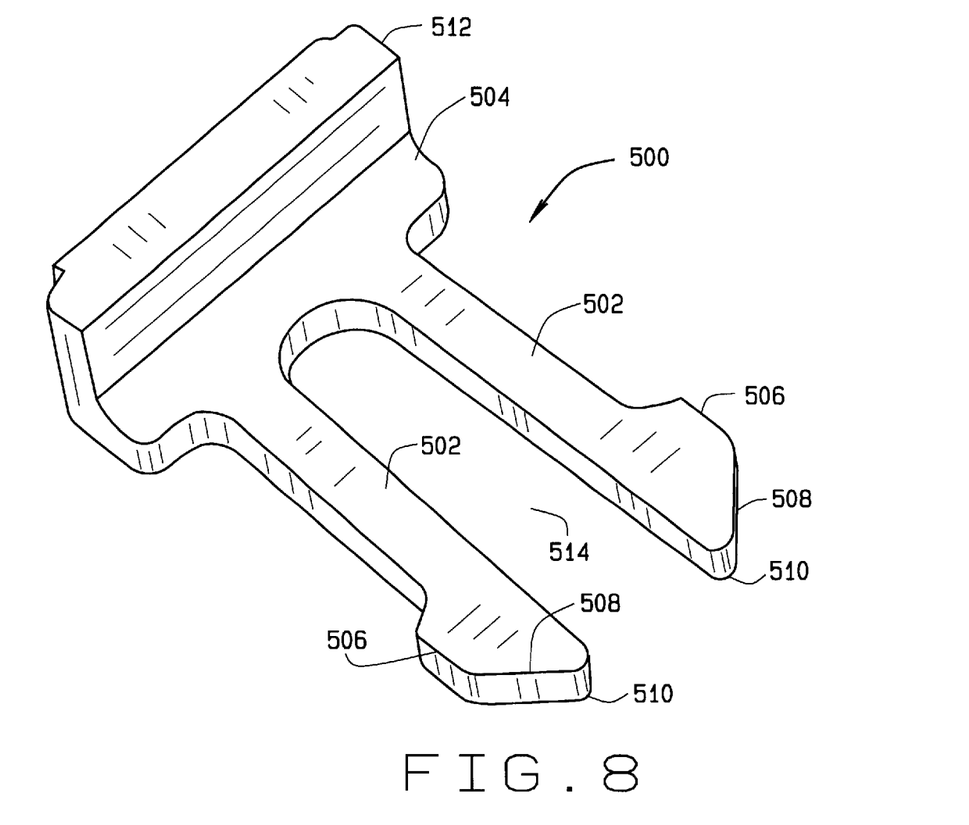
FIG. 8 is a perspective view of one exemplary connector position assurance device for the connector shown in FIG. 5.

FIG. 8 illustrates a connector position assurance device 500 in accordance with one embodiment of the present invention. Device 500 is a resilient molded plastic device and includes two resilient prongs 502 extending away from a body 504 and ending with a widened section 506 of resilient prongs 502. Continuing along an axis of resilient prongs 502 for a length, widened section 506 begins to narrow starting a narrowed section 508 until resilient prongs 502 end in a soft point 510. Body 504 of device 500 includes a raised section 512 used to grip device 500 at insertion. A space 514 between resilient prongs 502 allow resilient prongs 502 to compress towards one another during insertion of device 500. Device 500 is configured for insertion into molded latch 311 (shown in FIG. 3) wherein the action of insertion compresses resilient prongs 502 until the insertion process causes widened area 506 to be inserted past molded latch at which time resilient prongs 502 uncompress and cause device 500 to be retained by molded latch 311. Device 500, when in place, restricts compression of raised tab 414 of connector 400 (shown in FIG. 5) and keeps connector 400 from disengaging connector housing 308 and consequently the terminals or contacts 103 (shown in FIG. 3) and 104 (shown in FIGS. 1a, 2d, 2e and 2f).

Figure 9:
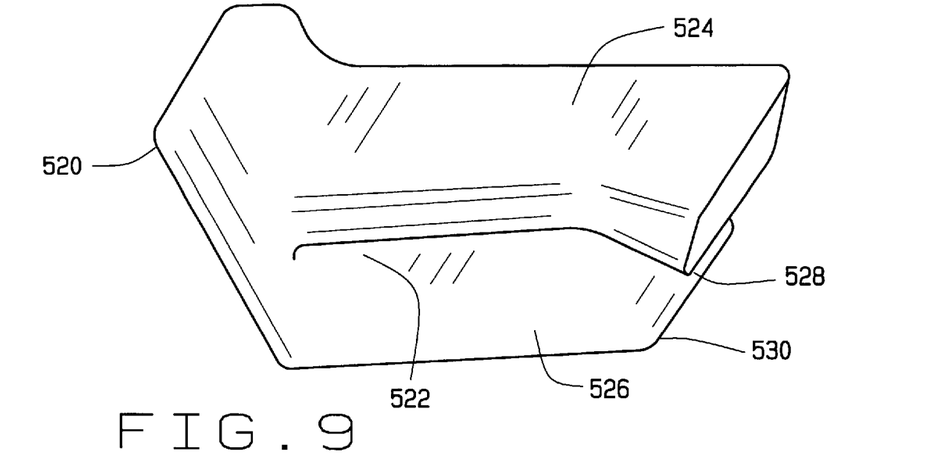
FIG. 9 is a perspective view of a second embodiment of a connector position assurance device.

FIG. 9 illustrates an embodiment of a second connector position assurance device 520 in accordance with another embodiment of the present invention. Device 520 is a molded plastic device and includes a slot 522 molded between an upper arm 524 and a lower arm 526 of device 520. Slot 522 is configured to engage a rectangular section 408 of a latching mechanism 406 of a connector 400 (all shown in FIG. 5) in a snap-fit connection with a bulge 528 molded into upper arm 524 which overlaps the plane of lower arm 526 at a spot past a termination point 530 of lower arm 526.

Figure 10:
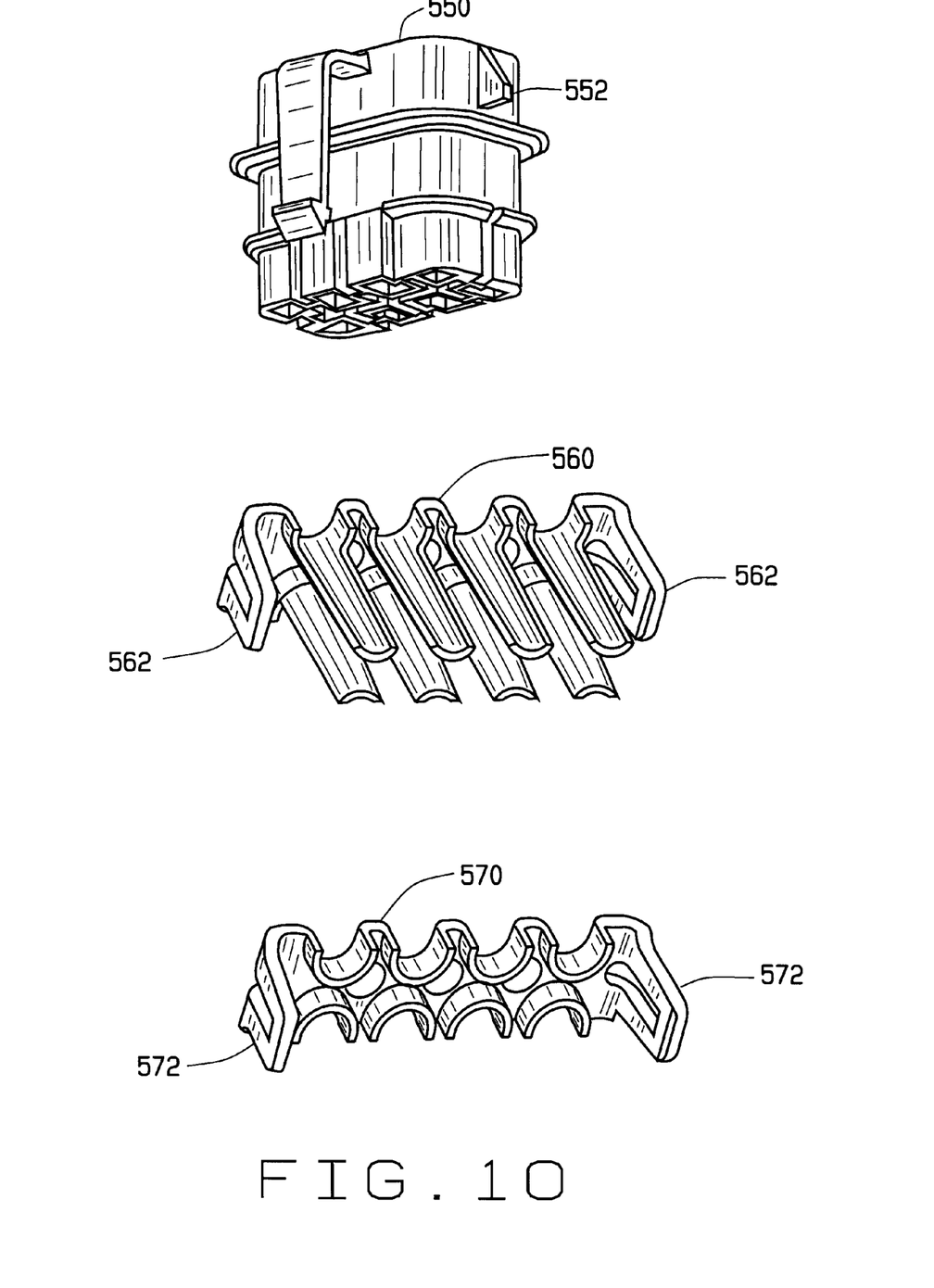
FIG. 10 is a perspective view of a connector assembly.

FIG. 10 shows an alternative embodiment for the securing of terminal position assurance devices to connectors. A connector 550 includes molded side tabs 552 (one side not shown in the figure) which retain either one of non-sealed terminal position assurance device 560 which includes at least two slotted members 562 used to engage side tabs 552. A sealed terminal position assurance device 570 also includes at least two slotted members 572 used to engage side tabs 552.

The above described embodiments have multiple advantages over any known electrical distribution apparatus in that the described features provide for flexibility, ease of use, ease of construction, safety, and alleviation of operating environment concerns. Integrity of electrical connections are ensured through assurance devices while disconnections can be made without the need of a tool for removal of the assurances devices. Discrete connector housings, not molded as part of an electrical distribution apparatus housing provide safety enhancements as both sides of an electrical connection employing connector housing are color coded. The above described apparatus fills a need for a reliable electrical distribution device, especially suited for the harsh operating conditions found in a vehicle operating environment.

While the invention has been described in terms of various specific embodiments, those skilled in the art will recognize that the invention can be practiced with modification within the spirit and scope of the claims.

What is claimed is:

1. A vehicle electric power distribution apparatus comprising:

a plurality of vertically stacked conductive circuit layers, each layer including a rectangular array of contact pads, wherein at least some of the contact pads are electrically connected to selected other contact pads of the same conductive circuit layer via integrally formed conductive traces;

at least one of the conductive circuit layers including at least one integrally formed electrical contact coplanar therewith, the contact extending outwardly from the conductive circuit layer, making electrical contact with at least one of the contact pads, and arranged to provide electrical contact with an external electric power distribution network;

electrically insulating material covering at least a portion of each conductive circuit layer;

a plurality of conductive pins providing electrical contact between selected contact pads of different selected conductive circuit layers, wherein at least one of the conductive pins includes an electrical connector on at least one end;

at least one electrical component arranged to make contact with the electrical connector;

a housing substantially surrounding the vertically stacked conductive circuit layers, said housing comprising a top portion and a bottom portion, wherein said top portion and said bottom portion are molded to receive at least one connector housing for acceptance of input and output contacts, and further configured to accept said connector housing between said top portion and said bottom portion.

2. An apparatus in accordance with claim 1 wherein bottom portion comprises a bottom surface, said bottom surface extending to said bottom portion at a plurality of locations, and configured to provide ventilation for said housing and to provide for escape of moisture from said housing.

3. An apparatus in accordance with claim 2 wherein said bottom surface comprises a plurality of sides and wherein each said side slopes slightly upward, to a center of said bottom surface, said center comprising a raised portion extending from said bottom surface thereby providing ventilation.

4. An apparatus in accordance with claim 3 wherein said bottom surface comprises a top side and a bottom side, said bottom side comprising a plurality of molded ribs extending from said center of said bottom surface to said sides of said bottom surface.

5. An apparatus in accordance with claim 1 wherein said housing comprises a plurality of mounting lugs, said mounting lugs located external to a housing compartment formed by joining said top portion and said bottom portion of said housing, said lugs located about a periphery of said bottom portion and formed in an arrangement that allows for vertical or side-by-side stacking of multiple of said housings.

6. An apparatus in accordance with claim 1 further comprising a cover hingedly connected to said top portion.

7. An apparatus in accordance with claim 6 wherein said cover is configured to mate with said top portion, thereby forming a water splash proof seal between said cover and said top portion.

8. An apparatus in accordance with claim 6 wherein said cover is configured with slots to provide ventilation.

9. An apparatus in accordance with claim 1 wherein said housing comprises a plurality of integral mounting lugs, said integral mounting lugs located within a housing compartment formed by joining said top portion and said bottom portion of said housing.

* * * * *